United States Patent
Narducci et al.

(10) Patent No.: US 9,671,216 B1
(45) Date of Patent: Jun. 6, 2017

(54) MODULATED LASER FOR ATOM INTERFEROMETERS

(71) Applicants: Francesco Narducci, Dowell, MD (US); Brandi Gerstner, Lexington Park, MD (US)

(72) Inventors: Francesco Narducci, Dowell, MD (US); Brandi Gerstner, Lexington Park, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 12 days.

(21) Appl. No.: 15/017,829

(22) Filed: Feb. 8, 2016

(51) Int. Cl.
| H03L 7/00 | (2006.01) |
| H03L 7/26 | (2006.01) |
| G01J 9/02 | (2006.01) |
| H01S 3/10 | (2006.01) |
| H01S 3/13 | (2006.01) |
| H01S 5/00 | (2006.01) |
| G01B 9/02 | (2006.01) |
| H01S 5/042 | (2006.01) |
| H01S 5/0687 | (2006.01) |
| G21K 1/00 | (2006.01) |

(52) U.S. Cl.
CPC ......... *G01B 9/02007* (2013.01); *G21K 1/006* (2013.01); *H01S 5/0078* (2013.01); *H01S 5/042* (2013.01); *H01S 5/0687* (2013.01)

(58) Field of Classification Search
USPC ............ 250/251; 372/18, 20, 23, 26, 28, 32, 372/38.06, 109
See application file for complete search history.

(56) References Cited

U.S. PATENT DOCUMENTS

| 5,274,232 A * | 12/1993 | Chu ................. G01C 19/58 250/251 |
| 5,668,826 A * | 9/1997 | Bezinge ................. H03L 7/26 372/109 |
| 7,944,317 B2 * | 5/2011 | Strabley ................. G04F 5/14 250/251 |
| 8,289,018 B2 * | 10/2012 | Narducci ............. G01R 33/022 250/251 |
| 8,676,062 B2 * | 3/2014 | Nakamoto ........... H04B 10/572 398/192 |
| 8,831,056 B2 * | 9/2014 | Savchenkov ............. G04F 5/14 372/18 |
| 9,086,429 B1 * | 7/2015 | Biedermann ......... G01P 15/093 |
| 9,291,508 B1 * | 3/2016 | Biedermann ............. G01J 9/02 |
| 2011/0101972 A1 * | 5/2011 | Narducci ............. G01R 33/022 324/244 |
| 2014/0190254 A1 * | 7/2014 | Bouyer .................... G01V 7/14 73/382 G |

OTHER PUBLICATIONS

Cronin et al., "Atom Interferometers", arXiv:0712.3703v1[quant-ph] Dec. 21, 2007.*

* cited by examiner

*Primary Examiner* — Bernard Souw
(74) *Attorney, Agent, or Firm* — Mark O. Glut; NAWCAD

(57) ABSTRACT

The present invention is directed to a modulated which includes a semiconductor laser being driven by direct current for frequency tuning, and an AC current with two radio frequencies that can generate repump and Raman frequencies, such that only one laser is needed to produce all the frequencies required to operate an atom interferometer. The present invention is also directed to a method of double modulating a laser to produce all required frequencies for an atom interferometer.

3 Claims, 2 Drawing Sheets

MODULATED LASER FOR ATOM INTERFEROMETERS

STATEMENT OF GOVERNMENT INTEREST

Figure 1:
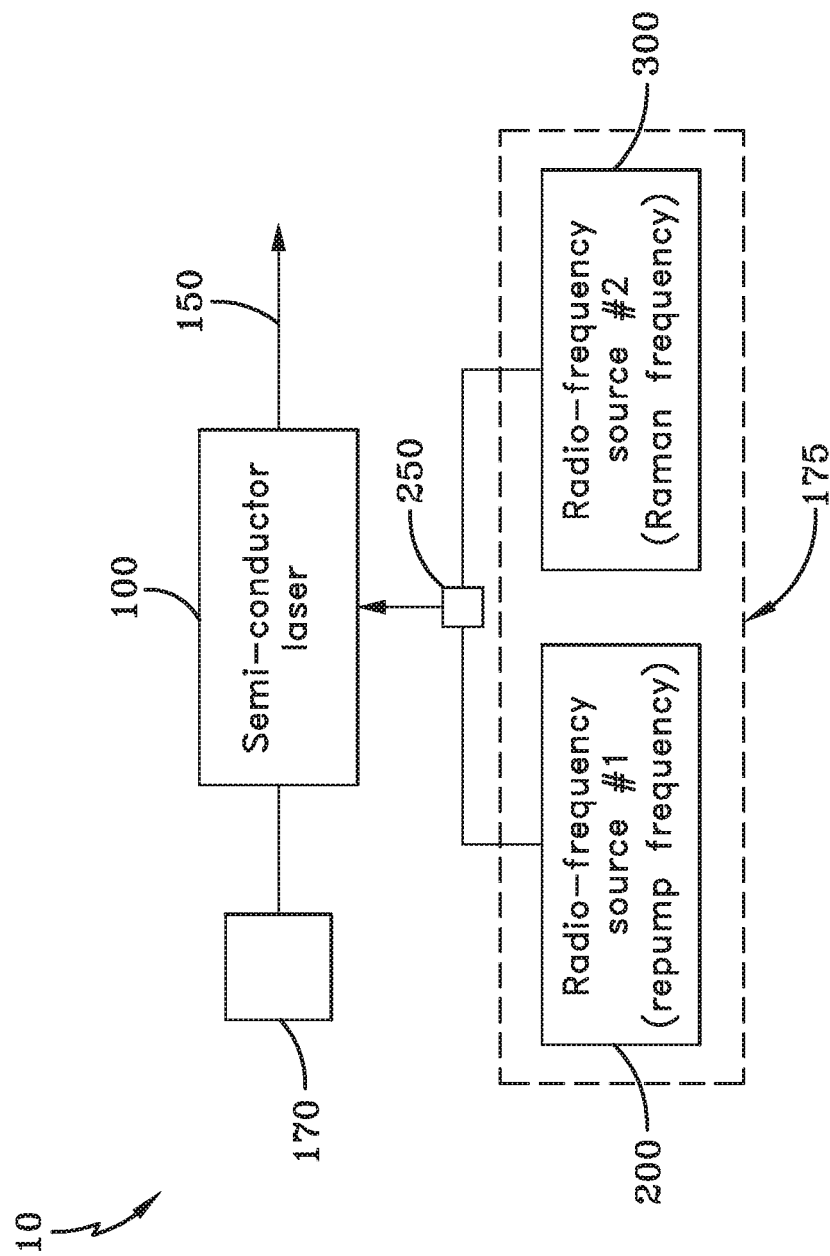

The invention described herein may be manufactured and used by or for the Government of the United States of America for governmental purposes without payment of any royalties thereon or therefor.

BACKGROUND

An atom interferometer is an interferometer based on exploiting the wave character of atoms. Atom interferometers are often used to make high-precision measurements of forces, such as those due to acceleration, rotation or magnetic fields. Typically, atom interferometers based on laser-cooled atoms require several lasers because of the need for several frequencies of light. These frequencies include the cooling frequency (near to a cycling atomic resonance), a repump frequency, and two frequencies far from the atomic cycling frequency, but whose frequency difference equals the atomic ground state frequency separation (Raman frequencies #1 and #2).

Typically atom interferometers using laser cooled atoms require up to four lasers to generate the required four frequencies. Furthermore, these lasers must be frequency stabilized, which requires complicated electronic feedback systems for each individual laser. Thus, there is a need to make the method and apparatus less complicated, smaller, and less expensive.

SUMMARY

The present invention is directed to a system with the needs enumerated above and below.

The present invention is directed to a modulated laser for atom interferometers which includes a semiconductor laser being driven by direct current for frequency tuning, and an AC current with two radio frequencies that can generate repump and Raman frequencies, such that only one laser is needed to produce all the frequencies required to operate an atom interferometer. The present invention is also directed to a method of double modulating a laser to produce all required frequencies for an atom interferometer using laser cooled atoms. The interferometer has an interferometry region, and the method comprises tuning laser current such that laser frequency coincides with required cooling frequency, modulating laser current to generate a frequency of light at a required repump frequency, modulating the laser current to generate two more frequencies of light that form laser frequency Raman #1 and laser frequency Raman #2, selecting the appropriate radio frequency modulation power such that the optical powers at each frequency is sufficient for interferometer operation, and filtering the repump frequency and the cooling frequency using an atomic filter such that the repump frequency and cooling frequency do not reach the atoms in interferometry region.

It is a feature of the present invention to provide a modulated laser for laser cooled atom interferometers and a method that only one laser is required for both laser cooling of atoms and atom interferometers.

It is a feature of the present invention to provide a modulated laser for a laser cooled atom interferometer and a method that eliminates the required use of three of the four electronic feedback systems.

It is a feature of the present invention to provide a modulated laser system for a laser cooled atom interferometer and a method that reduces the number of required lasers from three to four down to one.

It is a feature of the present invention to provide an atomic filter to prevent unwanted optical frequencies from reaching the interferometer region.

DRAWINGS

Figure 2:
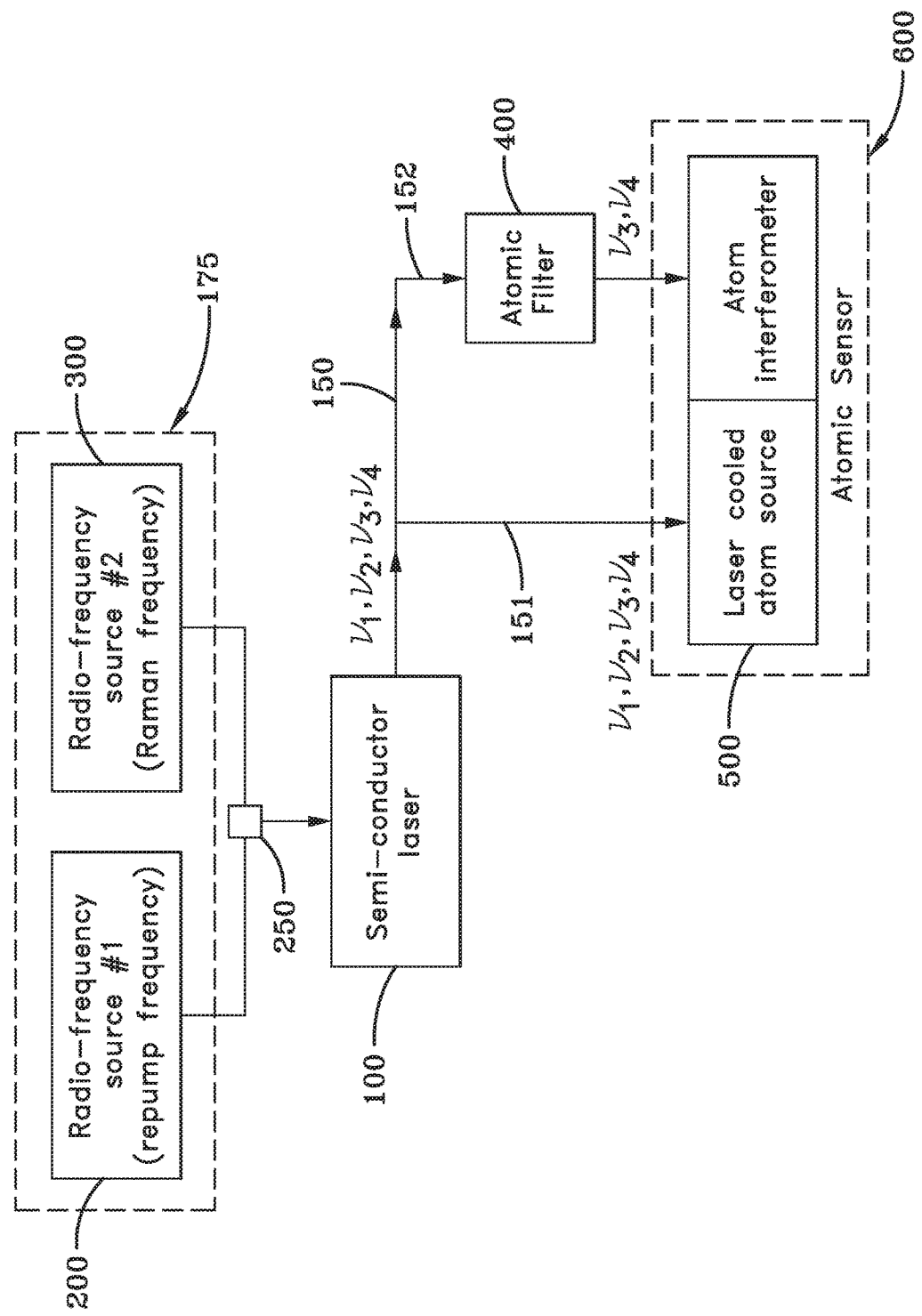

These and other features, aspects and advantages of the present invention will become better understood with reference to the following description and appended claims, and accompanying drawings wherein:

FIG. 1 is a depiction of the first portion of the invention wherein two radio frequency sources of appropriate power are connected to a semiconductor laser via a bias-tee; and, FIG. 2 is a depiction of the entire invention including a possible implementation in atomic sensors wherein two radio frequency sources of appropriate power are connected to a semiconductor laser via a bias-tee. Light emanating from the laser consists of four frequencies labeled $v_1$, $v_2$, $v_3$, $v_4$. Some of the light is split and sent to the laser cooled atom source with all four frequencies present. The remaining light passes through the atomic filter. Emerging from the filter are the frequencies $v_3$, $v_4$. These are sent to the atom interferometer.

DESCRIPTION

The preferred embodiments of the present invention are illustrated by way of example below and in FIGS. 1-2. As shown in FIG. 1, a modulated laser for atom interferometers 10 includes a semiconductor laser 100 being driven by direct current 170 for frequency tuning, and an AC current 175 with two radio frequencies that can generate repump 200 and Raman frequencies 300, such that only one laser 100 is needed to produce all the frequencies required to operate an atom interferometer 10.

A method of double modulating a laser to produce all required frequencies for an atom interferometer using laser cooled atoms is also presented. The interferometer has an interferometry region. The method comprises of tuning laser current such that laser frequency coincides with required cooling frequency, modulating laser current to generate a frequency of light at a required repump frequency, modulating the laser current to generate two more frequencies of light that form laser frequency Raman #1 and laser frequency Raman #2, and filtering the repump frequency and the cooling frequency using an atomic filter such the repump frequency and the cooling frequency do not reach the atoms in the interferometry region. In both the method and apparatus an atomic filter 400 may be used to filter out unwanted frequencies (cooling and repump) from the atom interferometer region.

In the description of the present invention, the invention will be discussed in a laboratory environment; however, this invention can be utilized for any type of application that requires use of atom interferometers.

As shown in FIG. 1, the invention comprises of a semiconductor laser 100, whose frequency is set by a direct current source 170. Two radio frequency sources 200, 300 are connected to the semiconductor laser 100 directly via a bias-tee 250. The power of the radio frequency sources 200, 300 is set such that the majority of the optical power is at the desired frequencies, at the expense of the fundamental frequency. The frequencies of the radio frequency sources are chosen such that they can be used as a repump frequency 200 and as the Raman frequencies 300.

As shown in FIG. 2, light 150 emanating from the laser 100 will now include four frequencies; a cooling frequency $v_1$, a repump frequency $v_2$, and the two Raman frequencies $v_3$, $v_4$. To utilize this invention for atomic sensors 600, the laser light 150 can be divided into two portions. The first portion 151 can be directed with all four frequencies $v_1$, $v_2$, $v_3$, $v_4$ towards a cell or laser cooled atom source 500 to produce laser cooled atoms. The second portion 152 of the light 150 passes through an atomic filter 400, which is a hot cell filled with the same atoms to be used in the atomic sensor 600. The atomic filter 400 has the effect of filtering out the cooling frequencies $v_1$ and the repump frequencies $v_2$, but not the Raman frequencies $v_3$, $v_4$, because they are off-resonant. The light emerging from the atomic filter 400 then can be used in the interferometer region.

When introducing elements of the present invention or the preferred embodiment(s) thereof, the articles "a," "an," "the," and "said" are intended to mean there are one or more of the elements. The terms "comprising," "including," and "having" are intended to be inclusive and mean that there may be additional elements other than the listed elements.

Although the present invention has been described in considerable detail with reference to certain preferred embodiments thereof, other embodiments are possible. Therefore, the spirit and scope of the appended claims should not be limited to the description of the preferred embodiment(s) contained herein.

What is claimed is:

1. A modulated laser for atom interferometers, the laser comprising:
   a semiconductor laser being driven by direct current for frequency tuning, and
   an AC current with two radio frequencies that can generate repump and Raman frequencies, such that only one laser is needed to produce all the frequencies required to operate an atom interferometer.

2. The method of double modulating a laser to produce all required frequencies for an atom interferometer using laser cooled atoms, the interferometer having an interferometry region, the method comprising:
   tuning laser current such that laser frequency coincides with required cooling frequency;
   modulating laser current to generate a frequency of light at a required repump frequency;
   modulating the laser current to generate two more frequencies of light that form laser frequency Raman #1 and laser frequency Raman #2; and,
   selecting an appropriate radio frequency modulation power such that optical power at each frequency is sufficient for interferometer operation,
   filtering the repump frequency and the cooling frequency using an atomic filter such the repump frequency and the cooling frequency do not reach the atoms in interferometry region.

3. The method of claim 2 wherein an atomic filter filters out unwanted frequencies (cooling and repump) from the atom interferometer region.

* * * * *